(12) United States Patent
Ruby

(10) Patent No.: US 7,629,865 B2
(45) Date of Patent: Dec. 8, 2009

(54) PIEZOELECTRIC RESONATOR STRUCTURES AND ELECTRICAL FILTERS

(75) Inventor: Richard C. Ruby, Menlo Park, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 245 days.

(21) Appl. No.: 11/443,954

(22) Filed: May 31, 2006

(65) Prior Publication Data

US 2007/0279153 A1    Dec. 6, 2007

(51) Int. Cl.
*H03H 7/00* (2006.01)
(52) U.S. Cl. .................................. 333/189; 333/188
(58) Field of Classification Search .......... 333/187–192
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandis et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,355,408 A | 10/1982 | Scarrott |
| 4,456,850 A | 6/1984 | Inoue et al. |
| 4,529,904 A | 7/1985 | Hattersley |
| 4,625,138 A | 11/1986 | Ballato |
| 4,640,756 A | 2/1987 | Wang et al. |
| 4,719,383 A | 1/1988 | Wang et al. |
| 4,798,990 A | 1/1989 | Henoch |
| 4,836,882 A | 6/1989 | Ballato |
| 4,841,429 A | 6/1989 | Mcclanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,075,641 A | 12/1991 | Weber et al. |
| 5,118,982 A | 6/1992 | Inoue et al. |
| 5,129,132 A | 7/1992 | Zdeblick et al. |
| 5,162,691 A | 11/1992 | Mariani et al. |
| 5,241,209 A | 8/1993 | Sasaki |

(Continued)

FOREIGN PATENT DOCUMENTS

DE     10160617     6/2003

(Continued)

OTHER PUBLICATIONS

Ruby, R. C., "Micro-Machined Thin Film Bulk Acoustic Resonators", *Proc. IEEE 48th, Symposium on Frequency control*, (1994),135-138.

(Continued)

*Primary Examiner*—James H Cho

(57) ABSTRACT

Film bulk acoustic resonators (FBARs) stacked FBARs (SBARS) including at least two curved edges are disclosed.

24 Claims, 5 Drawing Sheets

U.S. PATENT DOCUMENTS

| | | | |
|---|---|---|---|
| 5,241,456 A | 8/1993 | Marcinkiewicz et al. | |
| 5,294,898 A | 3/1994 | Dworsky et al. | |
| 5,361,077 A | 11/1994 | Weber | |
| 5,382,930 A | 1/1995 | Stokes et al. | |
| 5,384,808 A | 1/1995 | Van Brunt et al. | |
| 5,448,014 A | 9/1995 | Kong et al. | |
| 5,465,725 A | 11/1995 | Seyed-Bolorforosh | |
| 5,587,620 A | 12/1996 | Ruby et al. | |
| 5,589,858 A | 12/1996 | Kadowaki et al. | |
| 5,594,705 A | 1/1997 | Connor et al. | |
| 5,671,242 A | 9/1997 | Takiguchi et al. | |
| 5,692,279 A | 12/1997 | Mang et al. | |
| 5,705,877 A | 1/1998 | Shimada | |
| 5,714,917 A | 2/1998 | Ella | |
| 5,853,601 A | 12/1998 | Krishaswamy et al. | |
| 5,864,261 A | 1/1999 | Weber | |
| 5,866,969 A | 2/1999 | Shimada et al. | |
| 5,872,493 A | 2/1999 | Ella | |
| 5,873,153 A | 2/1999 | Ruby et al. | |
| 5,873,154 A | 2/1999 | Ylilammi et al. | |
| 5,894,184 A | 4/1999 | Furuhashi et al. | |
| 5,894,647 A | 4/1999 | Lakin | |
| 5,910,756 A | 6/1999 | Ella | |
| 5,932,953 A | 8/1999 | Drees et al. | |
| 5,936,150 A | 8/1999 | Kobrin et al. | |
| 5,953,479 A | 9/1999 | Zhou et al. | |
| 5,982,297 A | 11/1999 | Welle | |
| 6,040,962 A | 3/2000 | Kanazawa | |
| 6,060,818 A | 5/2000 | Ruby et al. | |
| 6,087,198 A | 7/2000 | Panasik | |
| 6,107,721 A | 8/2000 | Lakin | |
| 6,111,480 A | 8/2000 | Iyama et al. | |
| 6,124,756 A | 9/2000 | Yaklin et al. | |
| 6,150,703 A | 11/2000 | Cushman et al. | |
| 6,187,513 B1 | 2/2001 | Katakura | |
| 6,215,375 B1 | 4/2001 | Larson, III et al. | |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,600 B1 | 7/2001 | Haigh et al. | |
| 6,262,637 B1 | 7/2001 | Bradley et al. | |
| 6,265,246 B1 | 7/2001 | Ruby et al. | |
| 6,278,342 B1 | 8/2001 | Ella | |
| 6,292,336 B1 | 9/2001 | Cheng | |
| 3,607,761 A1 | 10/2001 | Nakagawa | |
| 6,307,447 B1 | 10/2001 | Barber et al. | |
| 6,366,006 B1 | 4/2002 | Boyd | |
| 6,376,280 B1 | 4/2002 | Ruby et al. | |
| 6,377,137 B1 | 4/2002 | Ruby | |
| 6,384,697 B1 | 5/2002 | Ruby | |
| 6,407,649 B1 | 6/2002 | Tikka et al. | |
| 6,414,569 B1 | 7/2002 | Nakafuku | |
| 6,420,820 B1 | 7/2002 | Larson, III | |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 | 8/2002 | Akihiko | |
| 6,441,539 B1 | 8/2002 | Kitamura et al. | |
| 6,462,631 B2 | 10/2002 | Bradley et al. | |
| 6,466,105 B1 | 10/2002 | Lobl et al. | |
| 6,466,418 B1 | 10/2002 | Cheng | |
| 6,469,597 B2 | 10/2002 | Ruby et al. | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Ylilammi et al. | |
| 6,486,751 B1 | 11/2002 | Barber et al. | |
| 6,489,688 B1 | 12/2002 | Baumann et al. | |
| 6,492,883 B2 | 12/2002 | Liang et al. | |
| 6,507,983 B1 | 1/2003 | Ruby et al. | |
| 6,515,558 B1 | 2/2003 | Ylilammi | |
| 6,518,860 B2 | 2/2003 | Ella et al. | |
| 6,525,996 B1 | 2/2003 | Miyazawa | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 | 4/2003 | Panasik | |
| 6,550,664 B2 | 4/2003 | Bradley et al. | |
| 6,563,400 B2 * | 5/2003 | Itasaka et al. | 333/187 |
| 6,564,448 B1 | 5/2003 | Oura et al. | |
| 6,566,979 B2 | 5/2003 | Larson et al. | |
| 6,583,374 B2 | 6/2003 | Knieser et al. | |
| 6,583,688 B2 | 6/2003 | Klee et al. | |
| 6,593,870 B2 | 7/2003 | Dummermuth et al. | |
| 6,600,390 B2 | 7/2003 | Frank | |
| 6,601,276 B2 | 8/2003 | Barber | |
| 6,617,249 B2 | 9/2003 | Ruby et al. | |
| 6,617,750 B2 | 9/2003 | Dummermuth et al. | |
| 6,630,753 B2 | 10/2003 | Malik et al. | |
| 6,635,509 B1 | 10/2003 | Ouellet | |
| 6,639,872 B1 | 10/2003 | Rein | |
| 6,651,488 B2 | 11/2003 | Larson et al. | |
| 6,657,363 B1 | 12/2003 | Aigner | |
| 6,668,618 B2 | 12/2003 | Larson et al. | |
| 6,670,866 B2 | 12/2003 | Ella et al. | |
| 6,693,500 B2 | 2/2004 | Yang et al. | |
| 6,710,508 B2 | 3/2004 | Ruby et al. | |
| 6,710,681 B2 | 3/2004 | Figueredo et al. | |
| 6,714,102 B2 | 3/2004 | Ruby et al. | |
| 6,720,844 B1 | 4/2004 | Lakin | |
| 6,720,846 B2 | 4/2004 | Iwashita et al. | |
| 6,724,266 B2 | 4/2004 | Piazza et al. | |
| 6,774,746 B2 | 8/2004 | Whatmore et al. | |
| 6,777,263 B1 | 8/2004 | Gan et al. | |
| 6,787,048 B2 | 9/2004 | Bradley et al. | |
| 6,788,170 B1 | 9/2004 | Kaitila et al. | |
| 6,803,835 B2 | 10/2004 | Frank | |
| 6,812,619 B1 | 11/2004 | Kaitila et al. | |
| 6,828,713 B2 | 12/2004 | Bradley et al. | |
| 6,842,088 B2 | 1/2005 | Yamada et al. | |
| 6,873,065 B2 | 3/2005 | Haigh et al. | |
| 6,873,529 B2 | 3/2005 | Ikuta | |
| 6,874,211 B2 | 4/2005 | Bradley et al. | |
| 6,874,212 B2 | 4/2005 | Larson, III | |
| 6,888,424 B2 | 5/2005 | Takeuchi et al. | |
| 6,900,705 B2 | 5/2005 | Nakamura et al. | |
| 6,903,452 B2 | 6/2005 | Ma et al. | |
| 6,906,451 B2 | 6/2005 | Yamada | |
| 6,911,708 B2 | 6/2005 | Park | |
| 6,917,261 B2 | 7/2005 | Unterberger | |
| 6,924,583 B2 | 8/2005 | Lin et al. | |
| 6,924,717 B2 | 8/2005 | Ginsburg et al. | |
| 6,927,651 B2 | 8/2005 | Larson, III et al. | |
| 6,936,928 B2 | 8/2005 | Hedler et al. | |
| 6,936,954 B2 | 8/2005 | Peczalski | |
| 6,946,928 B2 | 9/2005 | Larson, III et al. | |
| 6,954,121 B2 | 10/2005 | Bradley et al. | |
| 6,963,257 B2 | 11/2005 | Ella et al. | |
| 6,970,365 B2 | 11/2005 | Turchi | |
| 6,975,183 B2 | 12/2005 | Aigner et al. | |
| 6,977,563 B2 | 12/2005 | Komuro et al. | |
| 6,985,052 B2 | 1/2006 | Tikka | |
| 6,987,433 B2 | 1/2006 | Larson, III et al. | |
| 6,989,723 B2 | 1/2006 | Komuro et al. | |
| 6,998,940 B2 | 2/2006 | Metzger | |
| 7,019,604 B2 | 3/2006 | Gotoh et al. | |
| 7,019,605 B2 | 3/2006 | Larson et al. | |
| 7,057,476 B2 | 6/2006 | Hwu | |
| 7,084,553 B2 | 8/2006 | Ludwiczak | |
| 7,091,649 B2 | 8/2006 | Larson | |
| 7,098,758 B2 | 8/2006 | Wang et al. | |
| 7,170,215 B2 | 1/2007 | Namba et al. | |
| 7,173,504 B2 | 2/2007 | Larson | |
| 7,183,694 B2 * | 2/2007 | Nanataki et al. | 310/324 |

| | | | | | | |
|---|---|---|---|---|---|---|
| 7,187,254 | B2 | 3/2007 | Su et al. | EP | 1047189 | 10/2000 |
| 7,230,509 | B2 | 6/2007 | Stoemmer | EP | 1100196 | 11/2000 |
| 7,345,402 | B2 * | 3/2008 | Taniguchi et al. ......... 310/320 | EP | 1096259 | 5/2001 |
| 2002/0000646 | A1 | 1/2002 | Gooch et al. | EP | 1100196 A3 | 2/2002 |
| 2002/0030424 | A1 | 3/2002 | Iwata | EP | 1258990 | 11/2002 |
| 2002/0121944 | A1 | 9/2002 | Larson, III et al. | EP | 1180494 | 3/2003 |
| 2002/0121945 | A1 | 9/2002 | Ruby et al. | EP | 1542362 | 6/2003 |
| 2002/0152803 | A1 | 10/2002 | Larson, III et al. | EP | 1258989 | 1/2004 |
| 2002/0190814 | A1 | 12/2002 | Yamada et al. | EP | 1249932 | 3/2005 |
| 2003/0001251 | A1 | 1/2003 | Cheever et al. | EP | 1517443 | 3/2005 |
| 2003/0006502 | A1 | 1/2003 | Karpman | EP | 1517444 | 3/2005 |
| 2003/0051550 | A1 | 3/2003 | Nguyen et al. | EP | 1528674 | 5/2005 |
| 2003/0087469 | A1 | 5/2003 | Ma | EP | 1528675 | 5/2005 |
| 2003/0102776 | A1 | 6/2003 | Takeda et al. | EP | 1528677 | 5/2005 |
| 2003/0111439 | A1 | 6/2003 | Fetter et al. | EP | 1557945 | 7/2005 |
| 2003/0128081 | A1 | 7/2003 | Ella et al. | EP | 1575165 | 9/2005 |
| 2003/0132493 | A1 | 7/2003 | Kang et al. | GB | 1207974 | 10/1970 |
| 2003/0141946 | A1 | 7/2003 | Ruby et al. | GB | 2411239 | 8/2005 |
| 2003/0179053 | A1 | 9/2003 | Aigner et al. | GB | 2418791 | 4/2006 |
| 2004/0092234 | A1 | 5/2004 | Pohjonen | JP | 61054686 | 3/1986 |
| 2004/0124952 | A1 | 7/2004 | Tikka | JP | 2002/217676 | 8/2002 |
| 2004/0150293 | A1 | 8/2004 | Unterberger | WO | WO-98/16957 | 4/1998 |
| 2004/0150296 | A1 | 8/2004 | Park et al. | WO | WO-01/06647 | 1/2001 |
| 2004/0195937 | A1 | 10/2004 | Matsubara et al. | WO | WO-01/99276 | 12/2001 |
| 2004/0257172 | A1 | 12/2004 | Schmidhammer et al. | WO | WO-02/103900 | 12/2002 |
| 2004/0263287 | A1 | 12/2004 | Ginsburg et al. | WO | WO-03/030358 | 4/2003 |
| 2005/0012570 | A1 | 1/2005 | Korden et al. | WO | WO-03/043188 | 5/2003 |
| 2005/0023931 | A1 | 2/2005 | Bouche et al. | WO | WO-03/050950 | 6/2003 |
| 2005/0030126 | A1 | 2/2005 | Inoue et al. | WO | WO-03/058809 | 7/2003 |
| 2005/0036604 | A1 | 2/2005 | Scott et al. | WO | WO-2004/034579 | 4/2004 |
| 2005/0057117 | A1 | 3/2005 | Nakatsuka et al. | WO | WO-2004/051744 | 6/2004 |
| 2005/0057324 | A1 | 3/2005 | Onishi et al. | WO | WO-2005/043752 | 5/2005 |
| 2005/0068124 | A1 | 3/2005 | Stoemmer | WO | WO-2005/043753 | 5/2005 |
| 2005/0093396 | A1 | 5/2005 | Larson et al. | WO | WO-2005/043756 | 5/2005 |
| 2005/0093653 | A1 | 5/2005 | Larson, III | WO | WO-03/018788 | 2/2006 |
| 2005/0093654 | A1 | 5/2005 | Larson et al. | | | |
| 2005/0093655 | A1 | 5/2005 | Larson et al. | | | |
| 2005/0093657 | A1 | 5/2005 | Larson et al. | | | |
| 2005/0093658 | A1 | 5/2005 | Larson et al. | | | |
| 2005/0093659 | A1 | 5/2005 | Larson et al. | | | |
| 2005/0104690 | A1 | 5/2005 | Larson | | | |
| 2005/0110598 | A1 | 5/2005 | Larson, III | | | |
| 2005/0128030 | A1 | 6/2005 | Larson et al. | | | |
| 2005/0140466 | A1 | 6/2005 | Larson III, et al. | | | |
| 2005/0167795 | A1 | 8/2005 | Higashi | | | |
| 2005/0193507 | A1 | 9/2005 | Ludwiczak | | | |
| 2005/0206271 | A1 | 9/2005 | Higuchi et al. | | | |
| 2005/0218488 | A1 | 10/2005 | Matsuo | | | |
| 2006/0087199 | A1 | 4/2006 | Larson et al. | | | |
| 2006/0103492 | A1 | 5/2006 | Feng et al. | | | |
| 2006/0125489 | A1 | 6/2006 | Feucht et al. | | | |
| 2006/0132262 | A1 | 6/2006 | Fazzlo et al. | | | |
| 2006/0164183 | A1 | 7/2006 | Tikka | | | |
| 2006/0185139 | A1 | 8/2006 | Larson III, et al. | | | |
| 2006/0238070 | A1 | 10/2006 | Costa et al. | | | |
| 2007/0084964 | A1 | 4/2007 | John et al. | | | |
| 2007/0085447 | A1 | 4/2007 | Larson | | | |
| 2007/0085631 | A1 | 4/2007 | Larson et al. | | | |
| 2007/0085632 | A1 | 4/2007 | Larson et al. | | | |
| 2007/0086080 | A1 | 4/2007 | Larson et al. | | | |
| 2007/0086274 | A1 | 4/2007 | Nishimura et al. | | | |
| 2007/0090892 | A1 | 4/2007 | Larson | | | |
| 2007/0170815 | A1 | 7/2007 | Unkrich | | | |
| 2007/0171002 | A1 | 7/2007 | Unkrich | | | |

FOREIGN PATENT DOCUMENTS

| | | |
|---|---|---|
| EP | 0231892 | 8/1987 |
| EP | 0637875 | 2/1995 |
| EP | 0689254 | 6/1995 |
| EP | 0865157 | 9/1998 |
| EP | 0880227 | 11/1998 |
| EP | 0973256 | 1/2000 |

OTHER PUBLICATIONS

Larson III, J. D., et al., "Measurement of Effective Kt2q,RpRs vs. Temperature for Mo/AIN/Mo Resonators", *2002 IEEE Ultrasonics Symposium*, Munich, Germany, (Oct. 2002),915-919.

Aoyama, T. et al., "Diffusion of Boron, Phosphorous, Arsenic and Antimony in Thermally Grown SiliconDioxide", *Fiujitsu Labs, J. Electromechanical Soc.*, vol. 146, No. 5, (1999),1879-1883.

Parker, T. E., et al., "Temperature-Compensated Surface Acoustic-Wave Devices with SiO2 Film Overlays", *J. Appl. Physics*, vol. 50, (1360-1369),Mar. 1979.

Tsubbouchi, K. et al., "Zero Temperature coefficient Surface Acoustic Wave Devices using Epitaxial AIN Films", *IEEE Ultrasonic symposium*, San Diaego, CA, 1082, (1982),240-245.

Lakin, K. M., "Thin Film Resonators and Filters", *IEEE Untrasonics Symposium*, Caesar's Tahoe, NV, (Oct. 1999),895-906.

Lakin, K. M., et al., "Temperature Compensated Bulk Acoustic Thin Film Resonators", *IEEE Ultrasonics Symposium*, San Juan, Puerto Rico, (Oct. 2000),855-858.

Ohta, S. et al., "Temperature Characteristics of Solidly Mounted Piezoelectric Thin Film Resonators", *IEEE Ultrasonics Symposium*, Honolulu, HI, (Oct. 2003),2011-2015.

Bauer, L. O., et al., "Properties of Silicon Implanted with Boron Ions through Thermal Silicon Dioxide", *Solid State Electronics*, vol. 16, No. 3, (Mar. 1973),289-300.

Topich, J. A., et al., "Effects of Ion Implanted Flourine in Silicon Dioxide", *Nuclear Instr. And Methods, Cecon Rec*, Cleveland, OH, (May 1978),70-73.

Spangenberg, B. et al., "Dependence of the Layer Resistance of Boron Implantation in Silicon and the Annealing Conditions", *Comptus Rendus de l'Academic Bulgare des Sciences*, vol. 33, No. 3, (1980),325-327.

Hara, K. "Surface Treatment of Quartz Oscillator Plate by Ion Implantation", *Oyo Buturi*, vol. 47, No. 2, (Feb. 1978),145-146.

Ng, J. et al., "The Diffusion Ion-Implanted Boron in Silicon Dioxide", *AIP Conf. Proceedings*, No. 122, (1984),20-33.

Pang, W. et al., "High Q Single-Mode High-Tone Bulk Acoustic Resonator Integrated With Surface-Machined FBAR Filter", *Microwave Symposium Digest, IEEE MTT-S International*, (2005),413-416.

R. Ruby, et al., The Effect of Perimeter Geometry on FBAR Resonator Electrical Performance, Microwave Symposium Digest, 2005 IEEE MTT-S International, pp. 217-221 (Jun. 12, 2005).

U.S. Appl. No. 10/971,169, filed Oct. 22, 2004, Larson III, John D., et al.

Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp. 389-400.

Reinhardt, Alexandre et al., "Design of Coupled Resonator Filters Using Admittance and Scattering Matrices", *2003 IEEE Ultrasonics Symposium*, (May 3, 2003),1428-1431.

Navas, J. et al., "Miniaturised Battery Charger using Piezoelectric Transformers", *IEEE*, (2001),492-496.

Jiang, Yimin et al., "A Novel Single-Phase Power Factor Correction Scheme", *IEEE*, (1993),287-292.

Lakin, K.M. "Coupled Resonator Filters", *2002 IEEE Ultrasonics Symposium*, (Mar. 2, 2002),901-908.

Lakin, K.M. et al., "High Performance Stacked Crystal Filters for GPS and Wide Bandwidth Applications", *2001 IEEE Ultrasonics Symposium*, (Jan. 1, 2001),833-838.

Krishnaswamy, S.V. et al., "Film Bulk Acoustic Wave Resonator Technology", (May 29, 1990),529-536.

Lobl, H.P. et al., "Piezoelectric Materials For BAW Resonators And Filters", *2001 IEEE Ultrasonics Symposium*, (Jan. 1, 2001),807-811.

Lakin, K.M. "Bulk Acoustic Wave Coupled Resonator Filters", *2002 IEEE International Frequency Control Symposium and PDA Exhibition*, (Jan. 2, 2002),8-14.

Jung, Jun-Phil et al., "Experimental And Theoretical Investigation On The Relationship Between AIN Properties And AIN-Based FBAR Characteristics", *2003 IEEE International Frequency Control Symposium and PDA Exhibition Jointly with the 17th European Frequency and Time Forum*, (Sep. 3, 2003),779-784.

Yang, C.M. et al., "Highly C Axis Oriented AIN Film Using MOCVD For 5GHx Band FBAR Filter", *2003 IEEE Ultrasonics Symposium*, (Oct. 5, 2003),pp. 170-173.

Martin, Steven J., et al., "Development Of A Low Dielectric Constant Polymer For The Fabrication Of Integrated Circuit Interconnect", *12 Advanced Materials*, (Dec. 23, 2000), 1769-1778.

Hadimioglu, B. et al., ""Polymer Films As Acoustic Matching Layers".", *1990 IEEE Ultrasonics Symposium Proceedings*, vol. 3 PP., Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007,(Dec. 1990),1337-1340.

"Search Report from corresponding application number", GB 0605779.8, (Aug. 23, 2006).

"Examination Report from UK for application", GB 0605971.1, (Aug. 24, 2006).

"Examination report corresponding to application No.", GB0605770.7, (Aug. 25, 2006).

"Examination Report corresponding to application No.", GB0605775.6, (Aug. 30, 2006).

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search Report from corresponding application No.", GB0620657.7, (Nov. 23, 2006).

Coombs, Clyde F., et al., "Electronic Instrument Handbook", *Second Edition*, McGraw-Hill, Inc., (1995),pp. 5.1 to 5.29.

"Partial GB Search Report for", Application No. GB0522393.8, (Jan. 9, 2006),4 pages.

"Partial GB Search Report for Application No.", GB0525884.3, (Feb. 2, 2006),4 pgs.

Auld, B. A., "Acoustic Resonators", Acoustic Fields and Waves in Solids, *Second Edition*, vol. II, (1990),250-259.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys.* 54(10), (Oct. 1983),5893-5910.

"Search Report from corresponding application", No. GB0605225.2, (Jun. 26, 2006).

"Search Report for Great Britain Patent Application", No. 0617742.2, (Mar. 29, 2007).

"Search Report for Great Britain Patent Application", No. 0617742.2, (Dec. 13, 2006).

"Search Report in the Great Britian Patent Application", No. 0619698.4, (Nov. 30, 2006).

Schuessler, Hans H., "Ceramic Filters and Resonators", Reprinted from *IEEE Trans. Sonics Ultrason.*, vol. SU-21, (Oct. 1974),257-268.

Fattinger, G. G., et al., "Coupled Bulk Acoustic Wave Resonator Filters: Key technology for single-to-balanced RF filters", 0-7803-8331-1/4/W20.00; *IEEE.MTT-S Digest*, (2004),927-929.

Choi, Sungjin et al., "Design of Half-Bridge Piezo-Transformer Converters in the AC Adapter Applications", *IEEE 2005*, 244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

\* cited by examiner

US 7,629,865 B2

PIEZOELECTRIC RESONATOR STRUCTURES AND ELECTRICAL FILTERS

BACKGROUND

In many electronic applications, electrical resonators are required. For example, in many wireless communications devices, radio frequency (rf) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Film Bulk Acoustic Resonator (FBAR). The FBAR has the advantage of small size and lends itself to Integrated Circuit (IC) manufacturing tools and techniques. The FBAR includes an acoustic stack comprising, inter alia, a layer of piezoelectric material disposed between two electrodes. Acoustic waves achieve resonance across the acoustic stack, with the resonant frequency of the waves being determined by the materials in the acoustic stack.

FBARs are similar in principle to bulk acoustic resonators such as quartz, but are scaled down to resonate at GHz frequencies. Because the FBARs have thicknesses on the order of microns and length and width dimensions of hundreds of microns, FBARs beneficially provide a comparatively compact alternative to known resonators.

Desirably, the bulk acoustic resonator excites only thickness-extensional (TE) modes, which are longitudinal mechanical waves having propagation (k) vectors in the direction of propagation. The TE modes desirably travel in the direction of the thickness (e.g., z-direction) of the piezoelectric layer.

Unfortunately, besides the desired TE modes there are lateral modes, known as Rayleigh-Lamb modes, generated in the acoustic stack as well. The Rayleigh-Lamb modes are mechanical waves having k-vectors that are perpendicular to the direction of TE modes, the desired modes of operation. These lateral modes travel in the areal dimensions (x, y directions of the present example) of the piezoelectric material.

Among other adverse affects, lateral modes deleteriously impact the passband response of an FBAR filter. In particular, the Rayleigh-Lamb modes establish discrete modes at resonance frequencies as determined by the lateral dimensions of the resonator. The result is that in measuring the insertion loss of the passband portion of the filter, one sees 'ripples' or 'dings' in the pass band where energy incident on the filter is not passed thru to the output, but "sucked out" and converted as heat or other mechanical energy.

While attempts have been made to improve the insertion loss as well as the quality (Q) factor of known FBARs, certain drawbacks remain. In addition, because wafer 'real estate' remains at a premium, there is a need to maximize the use of each unit area of wafer, to within the limits that electrostatic discharge will allow.

What are needed, therefore, are an acoustic resonator structure and an electrical filter that overcomes at least the shortcomings of known described above.

SUMMARY

In accordance with an illustrative embodiment, an electrical resonator includes a first electrode having at least two curved edges and at least one substantially linear edge. The resonator includes a second electrode having at least two curved edges and at least one substantially linear edge. Additionally, the resonator includes a layer of piezoelectric material disposed between the first and second electrodes, wherein thickness-extensional (TE) modes propagate along a thickness of the layer.

In accordance with another illustrative embodiment, an electrical resonator structure includes a plurality of electrical resonators. Each of the electrical resonators includes: a first electrode having at least two curved edges and at least one substantially linear edge; a second electrode having at least two curved edges and at least one substantially linear edge; and a layer of piezoelectric material disposed between the first and second electrodes. Thickness-extensional (TE) modes propagate along a thickness of the layer.

In accordance with yet another illustrative embodiment, an electrical filter includes one or more resonators. Each of the electrical filters includes a first electrode having at least two curved edges and at least one substantially linear edge; a second electrode having at least two curved edges and at least one substantially linear edge; and a layer of piezoelectric material disposed between the first and second electrodes, wherein thickness-extensional (TE) modes propagate along a thickness of the layer.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

The terms 'a' or 'an', as used herein are defined as one or more than one.

The term 'plurality' as used herein is defined as two or more than two.

The term 'curved' as used herein is defined as at least a portion of plane curve of a conic section; or as having or marked by a curve or smoothly rounded bend.

The term 'convex' as used herein is defined a having a surface or boundary that curves or bulges outwardly, as the exterior of a sphere.

The term 'concave' as used herein is defined as having a surface or boundary that curves inwardly.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the illustrative embodiments. Such methods and apparati are clearly within the scope of the present teachings.

Figure 1:
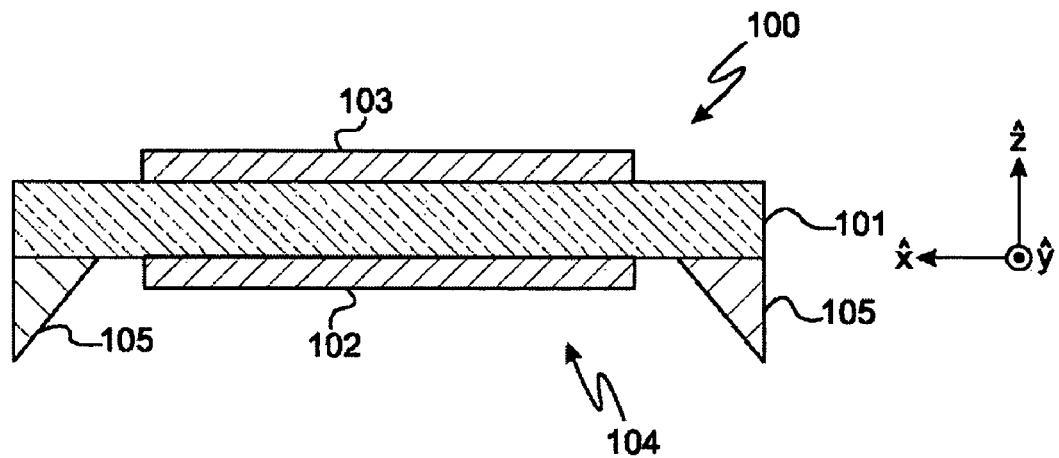
FIG. 1 is a cross-sectional view of an FBAR in accordance with an illustrative embodiment.

FIG. 1 is a cross-sectional view of an electrical resonator structure 100 in accordance with an illustrative embodiment. Illustratively, the structure 100 is an FBAR structure. The resonator structure 100 includes a layer of piezoelectric material 101 having a first surface in contact with a first electrode 102 and a second surface in contact with a second electrode 103. The electrodes 102, 103 include an electrically conductive material and provide an oscillating electric field in the z-direction, which is the direction of the thickness of the layer 101. As described more fully herein, in the present illustrative embodiment, the z-axis is the axis for the TE (longitudinal) mode(s) for the resonator.

The piezoelectric layer 101 and electrodes 102,103 are suspended over a cavity 104 formed by the selective etching of a substrate 105, which may be silicon or other semiconductor, or other suitable material. Accordingly, the resonator 100 is mechanical resonator, which can be electrically coupled via the piezoelectric layer. When connected to other resonators 100 the resulting array of resonators can act as an electrical filter. Other suspension schemes that allow the FBARs to resonate mechanically are possible. For example, the resonator 100 can be located over a mismatched acoustic Bragg reflector (not shown) formed in or on a substrate, as disclosed by Lakin in U.S. Pat. No. 6,107,721, the disclosure of which is specifically incorporated into this disclosure by reference in its entirety.

The resonator structure 100 may be fabricated according to known semiconductor processing methods and using known materials. Illustratively, the structure 100 may be fabricated according to the teachings of U.S. Pat. Nos. 5,587,620, 5,873, 153 and 6,507,583 to Ruby, et al. The disclosures of these patents are specifically incorporated herein by reference. It is emphasized that the methods described in these patents are representative and other methods of fabrication and materials within the purview of one of ordinary skill in the art are contemplated.

As noted previously, upon application of the alternating electric field along the z-direction of the piezoelectric layer 101 mechanical waves are launched in the layer 101. The mechanical waves useful in forming a resonator are the longitudinal waves having a k-vector in the z-direction. For a given phase velocity of sound in the material, the mechanical resonant frequency is that for which the half-wavelength of the sound wave propagating longitudinally in the device is equal to the total thickness of the device. For the desired TE (or dilational) mode in the z-direction, the resonant frequency $(f_d)$ is given by $(c_{TE}/2L)$, where $c_{TE}$ is the speed of sound of the TE mode. The term 'L' is the total weighted thickness (z-direction) of the piezoelectric layer 101 and the metal electrodes sandwiching the piezoelectric layer. The weighting function is due to the different velocities of sound for the electrodes as compared to the piezoelectric layer.

As will be appreciated by one of ordinary skill in the art, because the velocity of sound is four orders of magnitude smaller than the velocity of light, the resulting resonator 100 can be quite compact compared to known electrical resonators. For example, in applications requiring filtering in the GHz range the resonator may be constructed with areal (x,y according to the coordinate system shown) dimensions one the order of 100 to 200 microns and a thickness (z-direction) of few microns or less.

Figure 2:
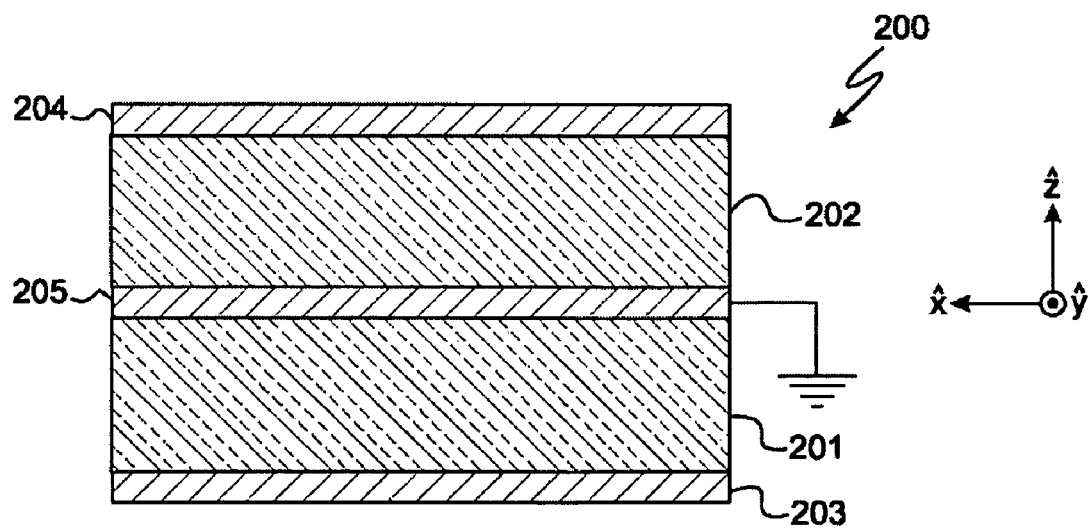
FIG. 2 is a cross-sectional view of a stacked bulk acoustic resonator (SBAR) in accordance with an illustrative embodiment.

FIG. 2 is a cross-sectional view of an SBAR 200 in accordance with an illustrative embodiment. The SBAR 200 comprises stacked FBAR structures that are mechanically coupled. As is known, the SBAR 200 may be used as an electrical pass-band filter. The SBAR 200 includes a first layer of piezoelectric material 201 and a second layer of piezoelectric material. A first electrode 203 is disposed beneath the first layer 201 and a second electrode 204 is disposed over the second layer 202. A third electrode 205 is disposed between the first and second layers 201, 202. An electrical signal across the first and third electrodes 203,205 at the resonance frequency of the first layer 201 will transmit mechanical energy to the second layer 202. The mechanical oscillations created are converted into electrical signals across the second and third electrodes, 205 and 204, respectively As noted previously, Rayleigh-Lamb (lateral) modes are in the x, y dimensions of the piezoelectric layers 101, 201, 202. These lateral modes are due to interfacial mode conversion of the longitudinal mode traveling in the z-direction; and due to the creation of non-zero propagation vectors, $k_x$ and $k_y$, for both the TE mode and the various lateral modes (e.g., the S0 mode and the zeroth and first flexure modes, A0 and A1), which are due to the difference in effective velocities between the regions where electrodes are disposed and the surrounding regions of the resonator where there are no electrodes. Mode conversion occurs when a wave encounters an interface between materials of different acoustic impedance and the incident angle is not normal to the interface. For instance, when longitudinal waves are incident on an interface at an angle, some of the wave energy can cause particle movement in the transverse direction to start a shear (transverse) wave. Thus, a longitudinal wave incident on an interface of dissimilar materials can result in the reflection of longitudinal and shear waves. Furthermore, these reflected waves can superpose (mix) in the material.

Illustratively, at the interface of the piezoelectric layer 101, 201, 202 and another material (e.g., air or metal), longitudinal modes traveling in a direction close to (but not exactly) the z-direction may experience mode conversion into shear vertical (SV) and longitudinal plane (P) waves that can be reflected back into the piezoelectric layer. The first four modes (eigensolutions), referred to as Rayleigh Lamb waves, can be launched in the lateral directions. These first four Rayleigh Lamb modes are the zeroth order symmetric ($S_0$) and antisymmetric ($A_0$) modes; and the first order symmetric ($S_1$) and antisymmetric ($A_1$) Lamb modes.

Regardless of their source, the lateral Lamb modes are parasitic in many resonator applications. For example, the parasitic lateral modes remove energy available for the longitudinal modes and can reduce the Q-factor of the resonator device. Notably, sharp reductions in Q can be observed on a Q-circle of the Smith Chart of the $S_{11}$ parameter. These sharp reductions in Q are known as "rattles." Moreover, in a plot of the insertion loss ($\ln(P_{out}/P_{in})$) versus frequency, energy loss is observed as reductions in the insertion loss corresponding to resonance frequencies of the parasitic lateral modes. These losses are often referred to as "suck-outs."

In accordance with illustrative embodiments described more fully herein, measures have been taken to reduce the magnitude of the suck-outs in the passband response of a filter and rattles in a Q circle measurement of a single resonator.

One such measure is known as apodization. Apodization comprises making a resonant piezoelectric structure where no two edges are parallel, and that the angle between two edges is not 90° or at rational angles. By providing non-parallel edges and no right-angles between edges, the effective path length of the lateral mode is increased. This increase in the effective path length decreases the frequencies of the fundamental parasitic modes.

By way of illustration, for a square or rectangular resonator formed by the electrodes, the frequency of the nth lateral mode is given by:

$$fn = c_{RL} * n / (2*L)$$

where n=1, 2, 3, 4 . . . ; $c_{RL}$ is the acoustic velocity of a particular Rayleigh-Lamb mode; and L is the separation between the two edges defined by the electrode. The factor "2" is due to the fact that the lateral mode energy must go from one edge to the other opposing edge and then back for a total (roundtrip) travel length of 2*L.

If, however, a Rayleigh-Lamb mode is launched from the edge of an apodized resonator, the path of the Rayleigh-Lamb wave results in multiple reflections from all of the edges of the resonator. It can be shown that the effective "round trip" path length is now many times larger than just 2*L. Ordinarily, the areal dimensions of a square resonator is on the order of 100 times that of the thickness. The path length for a "roundtrip" for a square or rectangular resonator is 2*L where L is the separation between the opposing edges.

Because of the apodization, only higher order harmonics of the fundamental lateral modes will exist in the passband. As is known, the coupling of the longitudinal mode along the z-direction to a lateral mode is inversely proportional to the order of the lateral mode. Thus, the $10^{th}$ harmonic will couple $\frac{1}{10}$ the energy as a fundamental mode.

Although apodization results in a larger number of fundamental lateral modes and their harmonics, because the coupling to higher order lateral harmonics is inversely proportional to the order of the mode, a 'smoothing' of the Q-curve on the Smith chart is experienced over certain frequency ranges, with a greater number of rattles, but of much smaller magnitude. Further details of apodization may be found in: U.S. Pat. No. 6,215,375 to Larson III, et al; and "The Effect of Perimeter Geometry on FBAR Resonator Electrical Performance" to Richard Ruby, et al. Microwave Symposium Digest, 2005 IEEE MTT-S International, pages 217-221 (Jun. 12, 2005). The disclosures of this patent and paper are specifically incorporated herein by reference in their entirety.

In accordance with illustrative embodiments also described herein, the ratio of the area to the perimeter is increased to improve the Q-factor. In particular, the lateral modes generated by mode conversion represent lost energy upon incidence with the perimeter of the of the FBAR resonator as defined by the overlapping electrodes. As such, at least some of the energy of the lateral mode is transmitted at the interface of the piezoelectric layer/electrode and the supporting substrate or frame. While some energy is retained as a reflection according to boundary conditions, each time a wave (reflected or otherwise) is incident upon the edge of the resonator, there is some energy loss. Thus, for a given area, reducing the perimeter will reduce loss and increase the Q-factor. As such, for a given area of the layer of piezoelectric material, it is useful to reduce the length of the perimeter.

The ratio of area to perimeter for a given area is largest in a circle. An ellipse has the next largest ratio and the lowest ratios can be found in Manhatten geometric structures, such as squares or triangles. Circles are often not desirable in FBAR applications because of rather strong transverse lateral modes (analogous to rectangular coordinates where the wave solution is a sinusoidal function, the eigenfunction for a circle is a Bessel function). By contrast, ellipses and other 'curved' geometries may be useful. However, and as noted previously, wafer real estate is always at a premium, so packing density of FBARs during fabrication and in an array of a finished product is usefully increased to within ESD limits, which requires devices to be no closer than approximately 20 microns.

As will be appreciated, curved geometries are among the least conducive to improved packing density, and Manhattan geometries are most conducive. Thus in accordance with illustrative embodiments described presently, curved geometries and (apodized) Manhattan geometries are combined to improve the Q-factor and the packing density, respectively.

Figure 3:
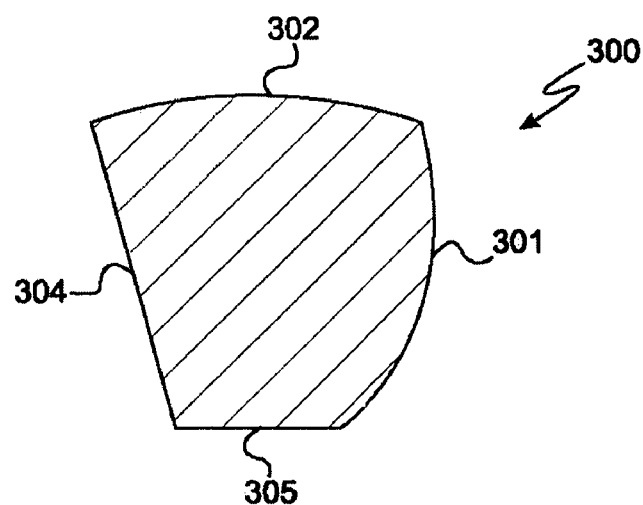
FIG. 3 is a top view of an electrode of an electrical resonator in accordance with an illustrative embodiment.

FIG. 3 is a top view of an electrode 300 of in accordance with an illustrative embodiment. The electrode 300 may be one of electrodes 103, 205 described previously and thus may be a component of the FBAR 100 or the SBAR 200 described previously.

The electrode 300 includes at least two edges that are curved. In the present embodiment, a first curved edge 301 is adjacent to a second curved edge 302. While two curved edges are provided in the present embodiment, it is possible to have other geometries with more than two edges curved. However, as will be appreciated, concave edges may effectively decrease the area to perimeter ratio for the same arc length of the curved edge. This is, therefore, counterproductive and may be deleterious to the Q-factor of the resonator. Thus, according to the illustrative embodiments, the curved edges are convex and not concave.

Beneficially, the curved edges 301, 302 increase the area to perimeter ratio and thus reduce energy loss to parasitic modes and improve the Q-factor of resonators incorporating the shaped edges.

The electrode 300 also includes a first linear edge 303 and a second linear edge 304. In the present embodiment, the first and second linear edges 303,304 are adjacent. The linear edges 302 and 303 are not parallel and are not at a right angle relative to one another. As such, the linear edges 302,303 are apodized and usefully 'smooth' rattles and suck-outs by spreading the energy of the lateral modes over a number of harmonics. In addition, and as described herein, the linear edges 303,304 particularly benefit the packing density.

In the illustrative embodiment, there are two linear edges. However, according to the present teachings there may be more linear edges; and there must be one linear edge. Regardless of their number, the linear edges are chosen to be non-parallel and to avoid right angles between adjacent edges and to avoid any other rational angle (e.g. 30°, 45°, 60°, etc.). In general, no two linear edges form an angle of mod p*π/q, where p and q are integers.

Figure 4:
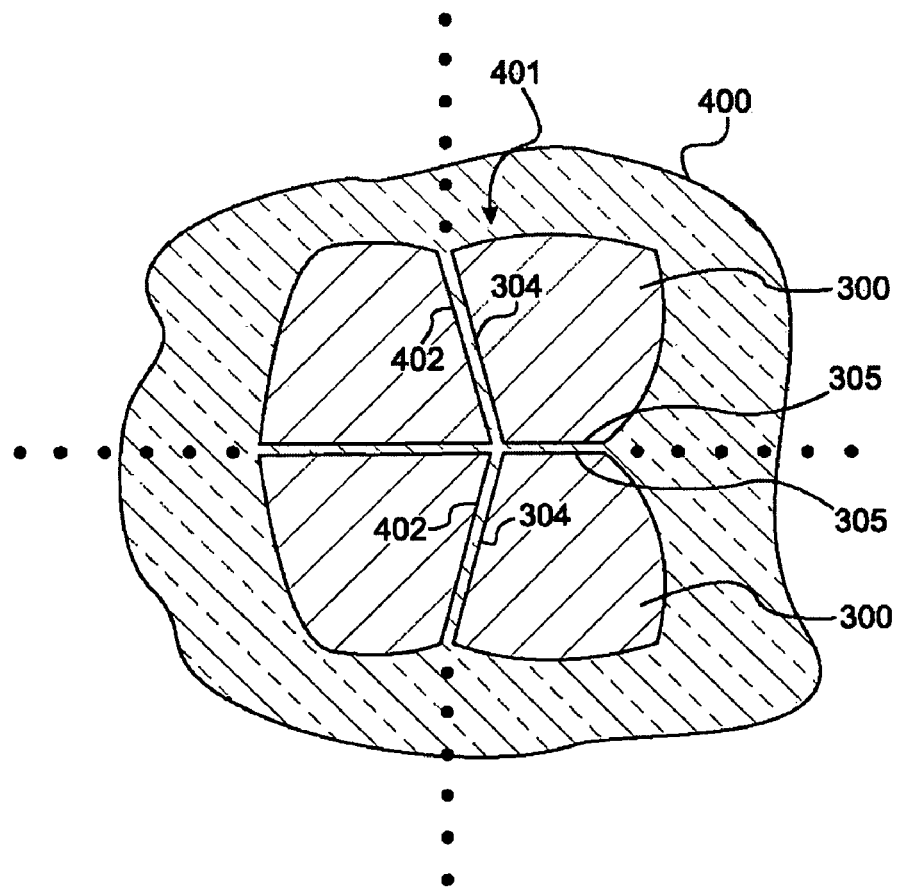
FIG. 4 is a top view of an array of electrodes of electrical resonators in accordance with an illustrative embodiment.

FIG. 4 is a top view of a portion of a substrate 400 including of a plurality of electrodes 300 forming an array 401 of electrodes in accordance with illustrative embodiment. The array 401 may be a few of the electrodes 300 formed over a substrate 400. Notably, the shapes of the electrodes of the array may be substantially, but are not necessarily, the same.

As indicated by the dashed lines, the array 401 may include additional electrodes (not shown) of resonators in accordance with one or more embodiments in the same or different pattern than shown. The additional electrodes have curved and linear edges in keeping with the present teachings to improve the Q-factor of the resonators and increase the packing density of the resonators. Alternatively, the array 401 may be a portion of a resonator structure comprising a selected number of resonators in an FBAR or SBAR device. Notably, there is often a plurality of individual resonators in a device.

Metallization (not shown) for contacts and electrical connections, piezoelectric layer(s) (not shown) and other elements within the purview of one of ordinary skill in the art are provided over the substrate 400. These and other elements are fabricated in or over the substrate by methods described in the incorporated patent to Larson, et al. or other known methods. The array 401 may then be diced for further packaging.

As shown, the array 401 is laid out so the linear edges of nearest neighboring electrodes are substantially adjacent. As such, edges 402 and 304 of respective electrodes, being linear, are oriented to be adjacent and thus improve packing density. Furthermore, the edges 305 are also adjacent to improve packing density. In illustrative embodiments, the adjacent edges of nearest neighboring electrodes are linear, while the curved edges of these electrodes are not adjacent. In certain embodiments, curved edges are not adjacent to other curved edges.

In the illustrative embodiment of FIG. 4, the array comprises electrodes 300 that are substantially identical. However, the present teachings contemplate that at least one electrode 300 of the array 401 is not the same as the others. For example, in order to improve the packing density, one or more of the electrodes may be of a different shape, although including the at least two curved edges and at least one linear edge with apodization as needed. In another example, electrodes with more curved edges may be used along the edges of the array 401 to improve the Q-factor. In certain embodiments, the geometries of the electrodes are different, but the ratio of the area to the perimeter is substantially the same; and in other embodiments the ratios are not the same.

It is emphasized that the array 401 is merely illustrative of the geometries contemplated by the present teachings. In general, a combination of edges including at least two curved edges and at least one linear edge is contemplated. Such alternative geometries are within the purview of one of ordinary skill in the art having had the benefit of the present disclosure.

Figure 5A:
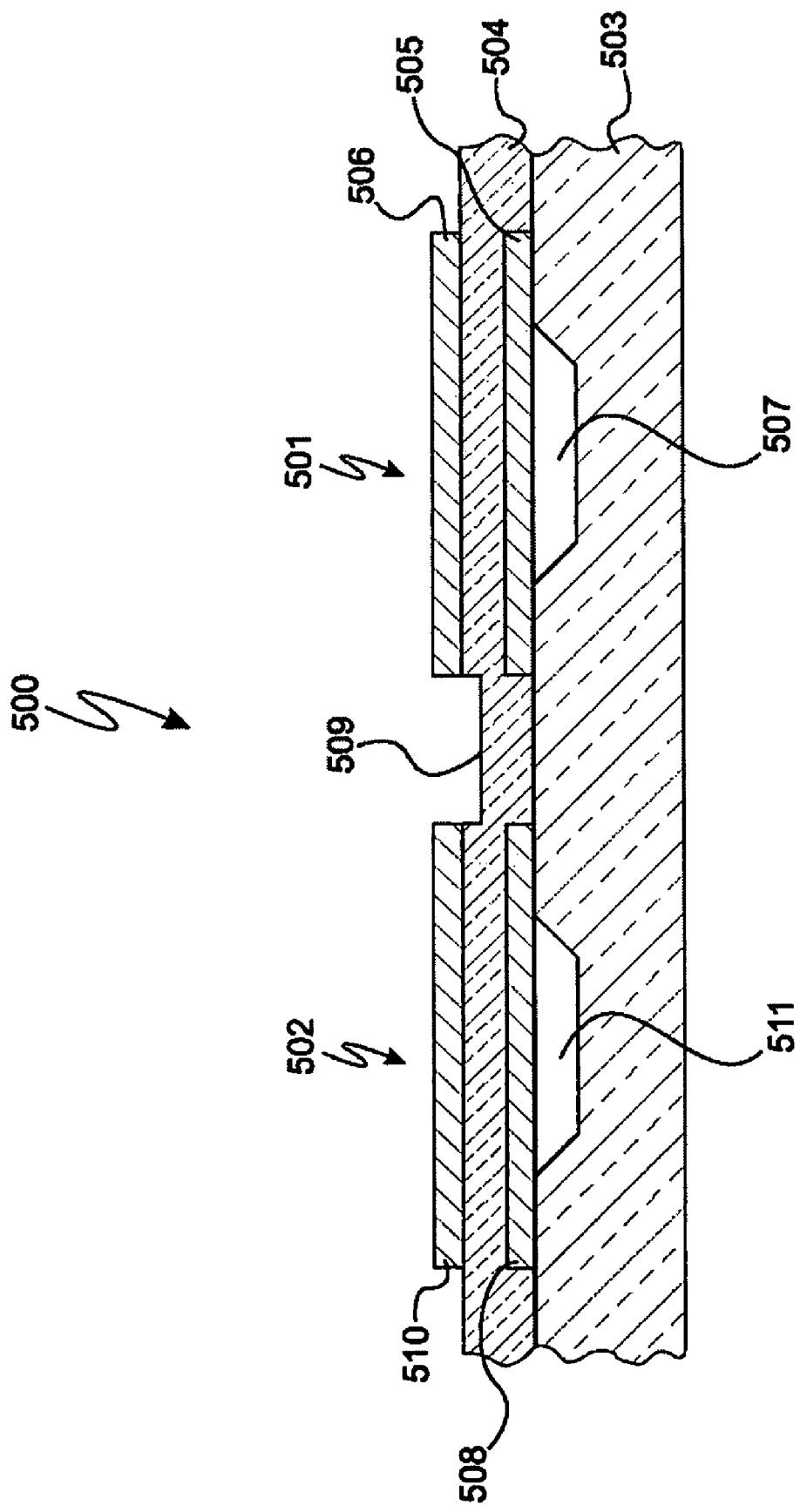
FIG. 5A is a cross-sectional view of a filter comprising more than one FBAR in accordance with an illustrative embodiment.

FIG. 5A is a cross-sectional view of a filter structure 500 in accordance with an illustrative embodiment. In the embodiment, two resonators 501, 502 are shown. Of course, this is merely illustrative and more resonators may be incorporated. For example, the array 401 of resonators may be used to realize the filter structure 500. Furthermore, the filter structure 500 and resonator structure thereof may be in accordance with the teachings of one or more of the following U.S. Pat. No. 6,642,631 to Bradley, et al.; U.S. Pat. Nos. 6,377,137 and 6,469,597 to Ruby; U.S. Pat. No. 6,472,954 to Ruby, et al.; and U.S. Pat. No. 6,710,681 to Figueredo, et al. The disclosures of the patents are specifically incorporated herein by reference in their entirety.

In addition, the resonators 501, 502 of the filter structure 500 may be fabricated in accordance with the teachings of U.S. Pat. No. 6,714,102 to Ruby, et al.; U.S. Pat. Nos. 6,874, 211 and 6,787,048 to Bradley, et al.; and U.S. Pat. No. 6,946, 928 to Larson, III, et al. The disclosures of the patents are specifically incorporated herein by reference in their entirety. It is emphasized that the methods described in these patents are representative and other methods of fabrication within the purview of one of ordinary skill in the art are contemplated.

The structure 500 includes a substrate 503, which may be a semiconductor substrate such as silicon, or other suitable material. The first resonator 501 includes a first electrode 505 disposed over a substrate 503, a layer of piezoelectric material 504 disposed over the first electrode 505 and a second electrode 506 disposed over the piezoelectric layer 504. A cavity 507 is formed in the substrate 503 and provides an air interface to the acoustic stack of the first resonator 501.

The second resonator 502 includes a first electrode 508 and a second electrode 510, with the layer 504 between the electrodes. These layers form the acoustic stack of the second resonator 502, and are disposed over a cavity 511, which provides an air interface.

Each of the electrodes 505, 506, 508 and 510 include edges such as those described in connection with the embodiments of FIGS. 1-4. As such, the packing density, Q-factor and insertion loss characteristics are improved as described above.

In the present embodiment, the packing density of the filter structure 500 is improved by providing linear edges of the electrodes 505, 506, 508 and 510 as nearest neighbors. Thus, the region 509 is the spacing between respective linear edges.

Figure 5B:
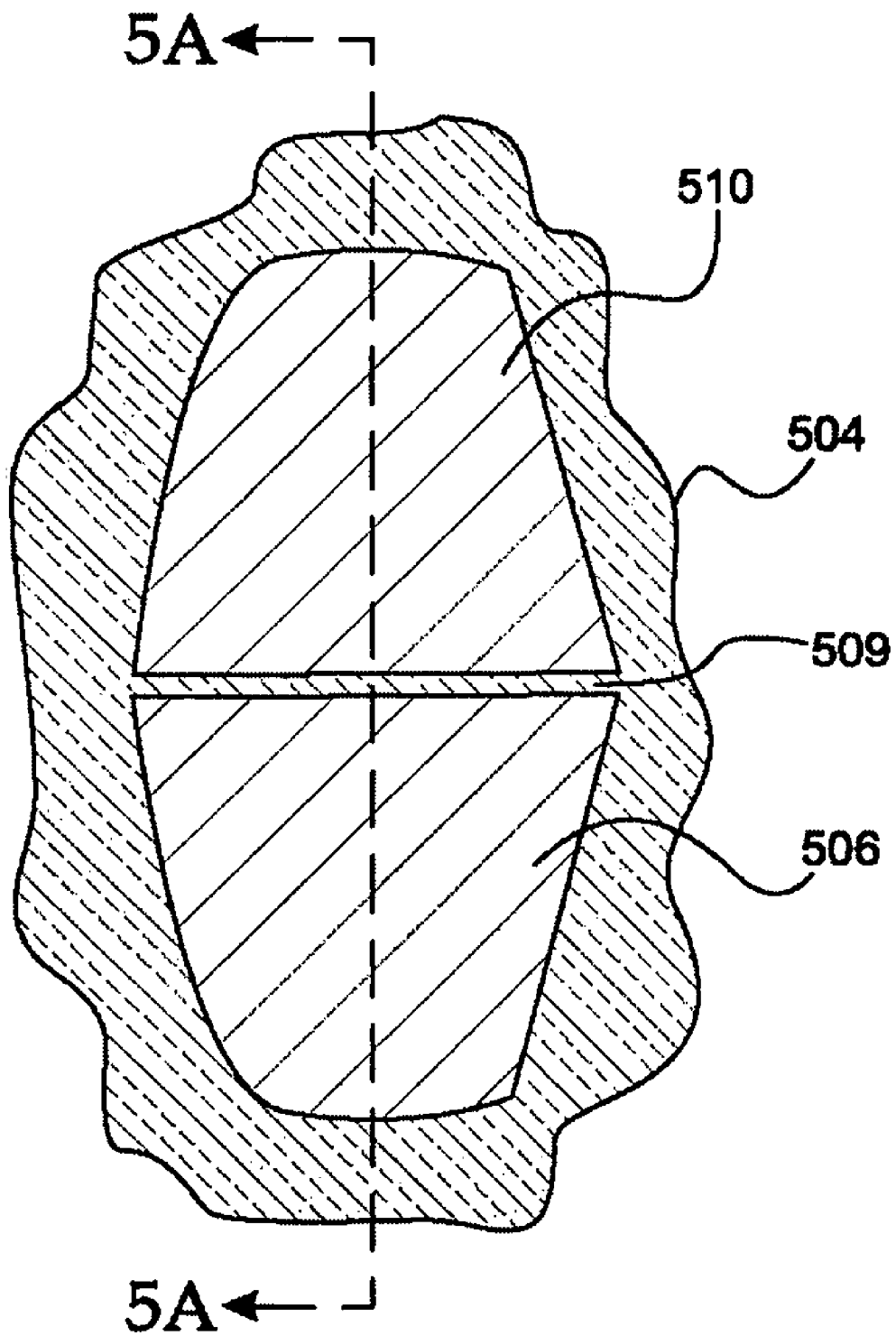
FIG. 5B is a top view of the filter shown in cross-section in FIG. 5A.

FIG. 5B is a top view of the filter structure 500. FIG. 5B shows more clearly the features of the electrodes that provide improved packing density, Q-factor and reduces 'suckouts' in the passband of the filter. In particular, as described previously, the electrodes 506, 510 are oriented so that adjacent edges are linear edges. In this embodiment, a linear edge of electrode 506 is adjacent to a linear edge of electrode 510 with region 509 disposed between the adjacent edges. In another arrangement with additional edges, the remaining linear edges of electrodes may be disposed adjacent linear edges of nearest neighbor electrodes (not shown) to realize a more densely packed filter structure. Such an arrangement may be as shown in FIG. 4, for example.

Finally, like the electrodes described previously, at least two edges of each electrode 506, 510 are curved. This improves the Q-factor of the resonator and the insertion loss characteristics noted previously.

Figure 6:
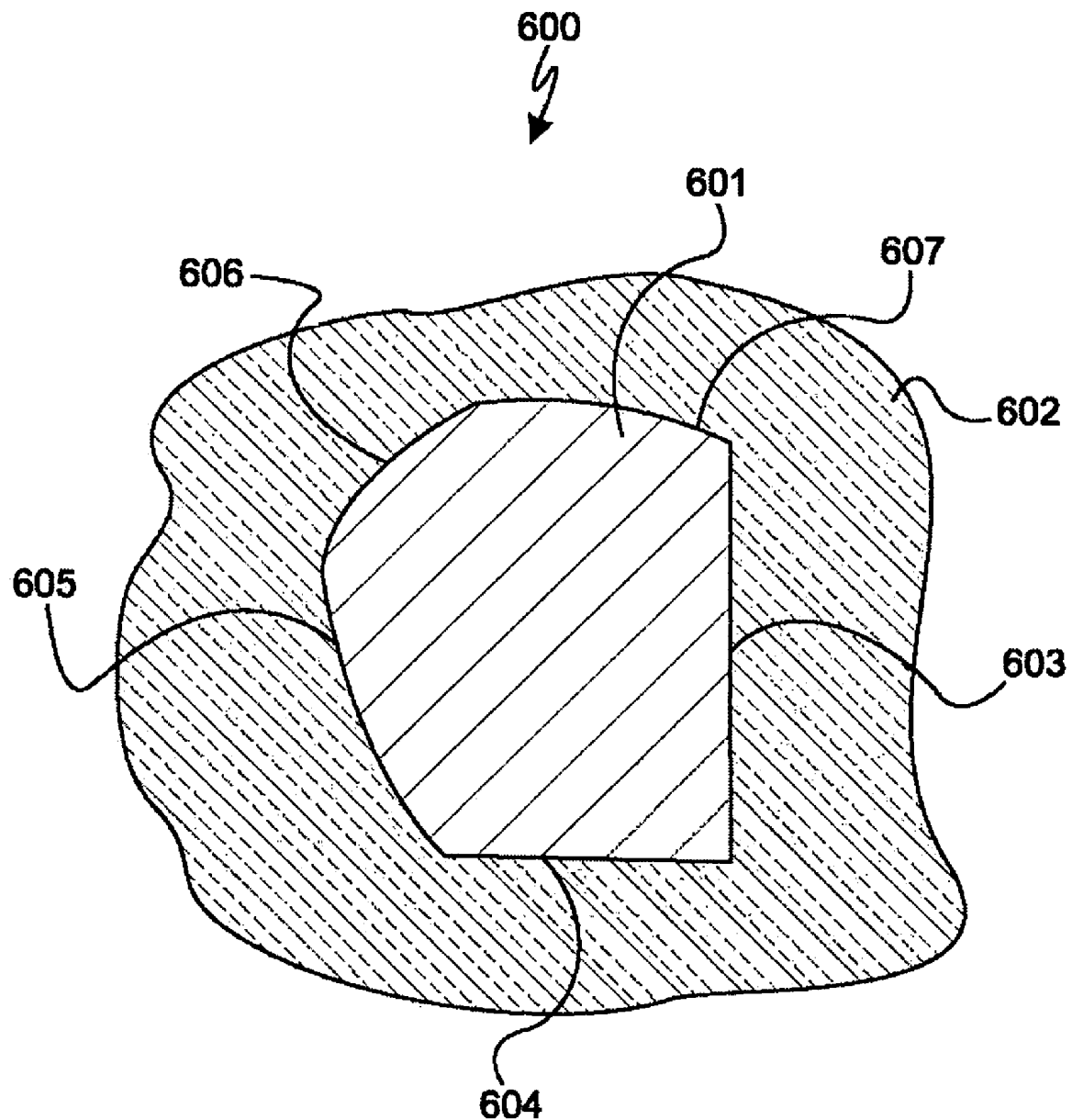
FIG. 6 is a top view of an electrode of an electrical resonator in accordance with an illustrative embodiment.

FIG. 6 is a top view of a resonator structure 600 in accordance with an illustrative embodiment. The resonator structure 600 includes many common features described in connection with the example embodiments described previously. Many of these features such as structure, materials and fabrication techniques are not repeated to avoid obscuring the description of the present embodiment.

The resonator structure 600 includes an electrode 601 disposed over a layer of piezoelectric material 602 that is formed over a substrate (not shown). Another electrode (not shown) that is substantially identical to the electrode 601 is disposed beneath the layer of piezoelectric material 602 and is aligned with the electrode 601 to complete a resonator structure.

The electrode 601 includes a first linear edge 603 and a second linear edge 604, which is adjacent to the first linear edge 603. The first and second linear edges 603,604 are not orthogonal and are not disposed at rational angles as described previously.

The electrode 601 also includes a first curved edge 605, a second curved edge 606 and a third curved edge 607. The first curved edge 605 is adjacent to the second curved edge 606, which is adjacent to the third curved edge 607.

In illustrative embodiments, a plurality of electrodes may be disposed over the substrate. As described previously, the linear edges 603,604 are beneficially adjacent to linear edges of a nearest neighbor electrode (not show). This serves to improve the packing density of resonators in fabricated over the substrate. In multi-resonator applications (e.g., filters), the improved packing density reduces the size of the resultant device.

Moreover, and as noted previously, the use of a plurality of curved edges beneficially increases the area to perimeter ratio of the electrode 601 and thus improves the Q-factor of the resonator structure 600 and the insertion loss characteristics of an electrical filter including the resonator structure 600.

In accordance with illustrative embodiments, electrical resonators include at least two curved edges and at least one substantially linear edge. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. An electrical resonator, comprising:
    a first electrode having at least two curved edges and at least one substantially linear edge, wherein the edges comprise a perimeter of the first electrode and none of the curved edges are concave;
    a second electrode having at least two curved edges and at least one substantially linear edge, wherein the edges comprise a perimeter of the second electrode and none of the curved edges are concave; and
    a layer of piezoelectric material disposed between the first and second electrodes, wherein thickness-extensional (TE) modes propagate along a thickness of the layer.

2. An electrical resonator as claimed in claim 1, wherein the first and second electrodes each further comprise at least one other substantially linear edge.

3. An electrical resonator as claimed in claim 2, wherein none of the linear edges of the first electrode are parallel to each other, and/or none of the linear edges of the second electrode are parallel to each other.

4. An electrical resonator as claimed in claim 2, wherein no two linear edges of the first electrode form an angle pπ/q, where p and q are integers, and/or no two linear edges of the second electrode the second electrode form an angle of mod pπ/q.

5. An electrical resonator as claimed in claim 1, further comprising:
    a third electrode having at least two curved edges and at least one substantially linear edge; and
    another layer of piezoelectric material disposed between the second and third electrodes, wherein TE modes propagate along a thickness of the other layer of piezoelectric material.

6. An electrical resonator as claimed in claim 5, wherein none of the curved edges are concave.

7. An electrical resonator as claimed in claim 5, wherein the third electrode further comprises at least one other substantially linear edge.

8. An electrical resonator as claimed in claim 7, wherein none of the linear edges of the third electrode are parallel.

9. An electrical resonator as claimed in claim 7, wherein no two linear edges of the third electrode form an angle of mod (pπq), where p and q are integers.

10. An electrical resonator structure, comprising:
    a plurality of electrical resonators, wherein each of the electrical resonators comprises:
    a first electrode having at least two curved edges and at least one substantially linear edge, wherein the edges comprise a perimeter of the first electrode and none of the curved edges are concave;
    a second electrode having at least two curved edges and at least one substantially linear edge, wherein the edges comprise a perimeter of the second electrode and none of the curved edges are concave; and
    a layer of piezoelectric material disposed between the first and second electrodes, wherein thickness-extensional (TE) modes wherein thickness-extensional (TE) modes propagate along a thickness of the layer.

11. An electrical resonator structure as claimed in claim 10, wherein each of the electrodes further comprises at least one other substantially linear edge.

12. An electrical resonator structure as claimed in claim 11, wherein none of the linear edges of the first electrode are parallel, and none of the linear edges of the second electrode are parallel.

13. An electrical resonator structure as claimed in claim 11, wherein no two linear edges of the first electrode form an angle of mod (pπq), where p and q are integers, and/or no two linear edges of the second electrode form an angle of mod (pπq).

14. An electrical resonator structure as claimed in claim 10, wherein the linear edge of the first electrode is adjacent to the linear edge of the second electrode.

15. An electrical resonator structure as claimed in claim 10, wherein each of the plurality of electrical resonators further comprises:
    a third electrode having at least two curved edges and at least one substantially linear edge; and
    another layer of piezoelectric material disposed between the second and third electrodes, wherein TE modes propagate along a thickness of the other layer of piezoelectric material.

16. An electrical resonator structure as claimed in claim 15, wherein none of the curved edges are concave.

17. An electrical resonator structure as claimed in claim 15, wherein the third electrode further comprises at least one other substantially linear edge.

18. An electrical resonator structure as claimed in claim 17, wherein none of the linear edges of the third electrode are parallel.

19. An electrical resonator structure as claimed in claim 17, wherein one of the linear edges of the third electrode is adjacent to the linear edge of the first electrode, or is adjacent to the linear edge of the second electrode.

20. An electrical resonator structure as claimed in claim 17, wherein no two linear edges of the third electrode form an angle of mod (pπ/q), where p and q are integers.

21. An electrical filter, comprising:
    one or more resonators, each of which includes:
    a first electrode having at least two curved edges and at least one substantially linear edge, wherein the edges comprise a perimeter of the first electrode and none of the curved edges are concave;
    a second electrode having at least two curved edges and at least one substantially linear edge, wherein the edges comprise a perimeter of the second electrode and none of the curved edges are concave; and
    a layer of piezoelectric material disposed between the first and second electrodes, wherein thickness-extensional (TE) modes propagate along a thickness of the layer.

22. An electrical filter as claimed in claim 21, wherein each electrode further comprises at least one other substantially linear edge.

23. An electrical filter as claimed in claim 22, wherein none of the linear edges of either of the first electrode are parallel, and/or none of the linear edges of the second electrode are parallel.

24. An electrical filter as claimed in claim 22, wherein no two linear edges of either of the first electrode or the second electrode form an angle of 90°.

* * * * *